US 12,190,982 B2

(12) United States Patent
Kim et al.

(10) Patent No.: US 12,190,982 B2
(45) Date of Patent: Jan. 7, 2025

(54) MEMORY AND OPERATION METHOD THEREOF

(71) Applicant: SK hynix Inc., Gyeonggi-do (KR)

(72) Inventors: Seung Chan Kim, Gyeonggi-do (KR); Keon Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 234 days.

(21) Appl. No.: 17/585,156

(22) Filed: Jan. 26, 2022

(65) Prior Publication Data

US 2023/0101173 A1 Mar. 30, 2023

(30) Foreign Application Priority Data

Sep. 30, 2021 (KR) .................... 10-2021-0130108

(51) Int. Cl.
| | |
|---|---|
| *G11C 7/10* | (2006.01) |
| *G11C 7/20* | (2006.01) |
| *G11C 29/00* | (2006.01) |
| *G11C 29/18* | (2006.01) |
| *G11C 29/44* | (2006.01) |

(52) U.S. Cl.
CPC ............. *G11C 29/76* (2013.01); *G11C 7/106* (2013.01); *G11C 7/1087* (2013.01); *G11C 7/20* (2013.01); *G11C 29/18* (2013.01); *G11C 29/4401* (2013.01)

(58) Field of Classification Search
CPC ....... G11C 29/76; G11C 7/106; G11C 7/1087; G11C 7/20; G11C 29/18; G11C 29/4401; G11C 2029/4402; G11C 29/789; G11C 29/808; G11C 29/702; G11C 29/787
See application file for complete search history.

(56) References Cited

U.S. PATENT DOCUMENTS

| | | | | |
|---|---|---|---|---|
| 9,666,308 | B2 * | 5/2017 | Noh ............... | G11C 29/4401 |
| 2016/0180969 | A1 * | 6/2016 | Noh ............... | G11C 29/78 365/96 |
| 2016/0351276 | A1 * | 12/2016 | Shim ............. | G11C 29/76 |
| 2020/0185052 | A1 | 6/2020 | Nale et al. | |

* cited by examiner

*Primary Examiner* — Mohammed A Bashar
(74) *Attorney, Agent, or Firm* — IP & T GROUP LLP (57) ABSTRACT

A memory includes: first to $N^{th}$ register circuits each suitable for receiving and storing a failure address transferred from a memory controller when a corresponding selection signal of first to $N^{th}$ selection signals is activated, where N is an integer equal to or greater than 2; first to $N^{th}$ resource latch circuits suitable for storing first to $N^{th}$ resource signals indicating availability of the first to $N^{th}$ register circuits, respectively; and a priority selection circuit suitable for activating, when two or more of the first to $N^{th}$ resource signals are activated, one of selection signals respectively corresponding to the activated resource signals among the first to $N^{th}$ selection signals.

10 Claims, 9 Drawing Sheets

| RESOURCE | | | | SELECTION | | | |
|---|---|---|---|---|---|---|---|
| <3> | <2> | <1> | <0> | <3> | <2> | <1> | <0> |
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 0 |
| 0 | 1 | 0 | 0 | 0 | 1 | 0 | 0 |
| 0 | 1 | 0 | 1 | 0 | 1 | 0 | 0 |
| 0 | 1 | 1 | 0 | 0 | 1 | 0 | 0 |
| 0 | 1 | 1 | 1 | 0 | 1 | 0 | 0 |
| 1 | 0 | 0 | 0 | 1 | 0 | 0 | 0 |
| 1 | 0 | 0 | 1 | 1 | 0 | 0 | 0 |
| 1 | 0 | 1 | 0 | 1 | 0 | 0 | 0 |
| 1 | 0 | 1 | 1 | 1 | 0 | 0 | 0 |
| 1 | 1 | 0 | 0 | 1 | 0 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 1 | 0 | 0 | 0 |

MEMORY AND OPERATION METHOD THEREOF

CROSS-REFERENCE TO RELATED APPLICATIONS

The present application claims priority to Korean Patent Application No. 10-2021-0130108, filed on Sep. 30, 2021, which is incorporated herein by reference in its entirety.

BACKGROUND

1. Field

Various embodiments of the present invention relate to a memory.

2. Description of the Related Art

Generally, a memory like a dynamic random access memory (DRAM) goes through a test process to determine whether the memory is defective or not after designing and fabrication.

If even one memory cell turns out to be defective among the numerous memory cells in the memory, the memory cannot perform its function properly and is abandoned as a defective product. However, even though there are a small number of defective memory cells, abandoning the memory as a defective product is inefficient in terms of yield. To overcome this problem, a method of providing a memory with redundant memory cells therein and replacing defective memory cells with the redundant memory cells through a test process is currently being used.

Post-package repair means repairing a memory after the package process. Post-package repair may be performed not only in the fabrication process of a memory, but also in the process of the memory being used by a user. For efficient post-package repair, a technique for efficiently allocating and managing repair resources inside a memory is important.

SUMMARY

Embodiments of the present invention are directed to a method for efficiently allocating and managing repair resources inside a memory.

In accordance with an embodiment of the present invention, a memory includes: first to $N^{th}$ register circuits each suitable for receiving and storing a failure address transferred from a memory controller when a corresponding selection signal of first to $N^{th}$ selection signals is activated, where N is an integer equal to or greater than 2; first to $N^{th}$ resource latch circuits suitable for storing first to $N^{th}$ resource signals indicating availability of the first to $N^{th}$ register circuits, respectively; and a priority selection circuit suitable for activating, when two or more of the first to $N^{th}$ resource signals are activated, one of selection signals respectively corresponding to the activated resource signals among the first to $N^{th}$ selection signals.

In accordance with another embodiment of the present invention, a method for operating a memory includes: entering a soft repair mode; searching for available register circuits among first to $N^{th}$ register circuits, where N is an integer equal to or greater than 2; selecting a register circuit of a high priority among the available register circuits; and storing a failure address transferred from a memory controller into the selected register circuit.

In accordance with yet another embodiment of the present invention, an operating method of a memory in a soft repair mode includes: storing a failure address, which is primarily provided from a controller, in a selected register circuit having a high priority among register circuits available from plural register circuits; and prohibiting the selected register circuit from storing subsequent data for further soft repair in response to a lock command accompanying the failure address, which is subsequently provided from the controller.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 1:
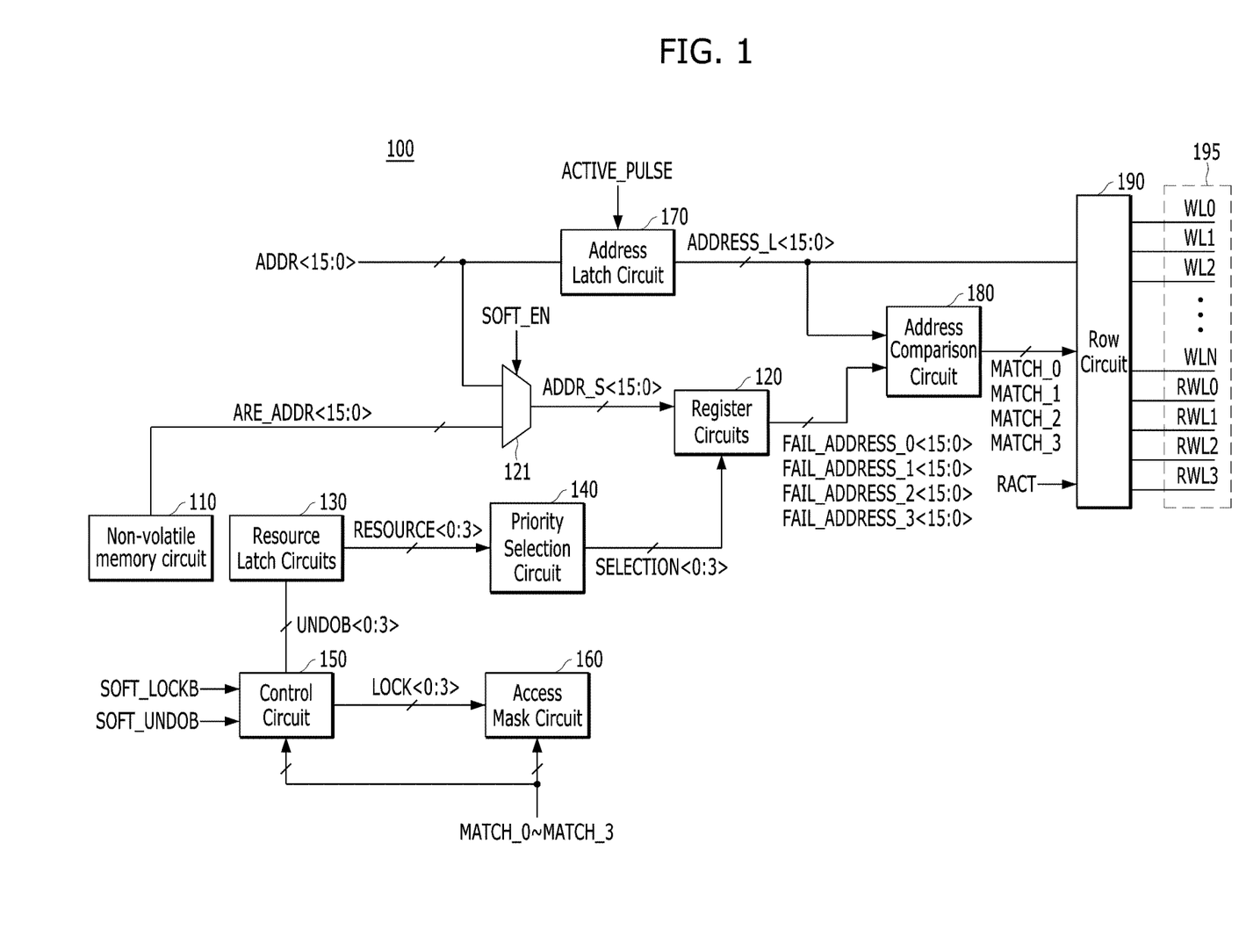
FIG. 1 is a block diagram illustrating a memory 100 in accordance with an embodiment of the present invention.

FIG. 1 is a block diagram illustrating a memory 100 in accordance with an embodiment of the present invention.

Referring to FIG. 1, the memory 100 may include a non-volatile memory circuit 110, register circuits 120, resource latch circuits 130, a priority selection circuit 140, a control circuit 150, an access mask circuit 160, an address latch circuit 170, an address comparison circuit 180, a row circuit 190, and a cell array 195.

The non-volatile memory circuit 110 may store repair data, that is, failure addresses. The non-volatile memory circuit 110 may include a plurality of e-fuses and may store failure addresses in the e-fuses. Generally, failure addresses corresponding to the defects detected in the tests performed during a fabrication process of the memory 100 may be stored in the non-volatile memory circuit 110. The non-volatile memory circuit 110 may also be referred to as an e-fuse array circuit. Those skilled in the art to which the present invention pertains would realize that the non-volatile memory circuit 110 may be formed to include other types of non-volatile memory cells, which are not e-fuses.

The register circuits 120 may store failure addresses to be repaired. The register circuits 120 may store a failure address ARE_ADDR<15:0> transferred from the non-volatile memory circuit 110 during a boot-up operation performed at the initial stage of the operation of the memory 100. Also, the register circuits 120 may receive and store the failure address ADDRESS<15:0> transferred from the outside of the memory 100, e.g., a memory controller, during a soft repair operation. That is, a portion of the register circuits 120 may store the failure address ARE_ADDR<15:0> transferred from the non-volatile memory circuit 110 during a boot-up operation, and the rest of the register circuits 120 may receive and store the failure address ADDRESS<15:0> transferred from the outside of the memory 100 during a soft repair operation. Among the memory cells of the cell array 195, memory cells corresponding to the failure addresses stored in the register circuits 120 may be repair targets. A selection circuit 121 in the front end of the register circuits 120 may transfer the failure address ADDRESS<15:0> transferred from the outside of the memory 100 to the register circuits 120 during a soft repair operation, that is, when a soft repair signal SOFT_EN is activated. Otherwise, the selection circuit 121 may transfer the failure address ARE_ADDR<15:0> transferred from the non-volatile memory circuit 110 to the register circuits 120.

The address latch circuit 170 may receive and store the address ADDRESS<15:0> transferred from the outside of the memory 100 during an active operation. The address stored in the address latch circuit 170 may be an address for designating the memory cells to be accessed in the cell array 195. Here, the number of the bits of the address ADDRESS<15:0> is illustrated as 16 bits. An active pulse ACTIVE_PULSE which is input to the address latch circuit 170 may be a pulse signal which is activated during an active operation, and the address latch circuit 170 may receive and store an address in response to the activation of the active pulse ACTIVE_PULSE.

The address comparison circuit 180 may compare the addresses ADDRESS_L<15:0> which are output from the address latch circuit 170 with failure addresses FAIL_ADDRESS_0<15:0>, FAIL_ADDRESS_1<15:0>, FAIL_ADDRESS_2<15:0> and FAIL_ADDRESS_3<15:0> to generate match signals MATCH_0 to MATCH_3. The match signal MATCH_0 may be activated when the failure address FAIL_ADDRESS_0<15:0> matches the address ADDRESS_L<15:0>. The match signal MATCH_1 may be activated when the failure address FAIL_ADDRESS_1<15:0> matches the address ADDRESS_L<15:0>. Similarly, the match signal MATCH_2 may be activated when the failure address FAIL_ADDRESS_2<15:0> matches the address ADDRESS_L<15:0>. The match signal MATCH_3 may be activated when the failure address FAIL_ADDRESS_3<15:0> matches the address ADDRESS_L<15:0>.

The row circuit 190 may activate one of the rows WL0 to WLN and RWL0 to RWL3 of the cell array 195 during an active operation in which a row active signal RACT is activated. The low active signal RACT may be a signal activated during the period of an active operation. That is, the low active signal RACT may be a signal that is activated in response to an active command and deactivated in response to a precharge command. When all of the match signals MATCH_0 to MATCH_3 are deactivated, the row circuit 190 may decode the address ADDRESS_L<15:0> to activate one of the normal rows WL0 to WLN. Also, when the match signals MATCH_0 to MATCH_3 are activated, the row circuit 190 may activate a redundant row corresponding to the activated match signal among redundant rows RWL0 to RWL3. For example, the row circuit 190 may activate a redundant row RWL0 when the match signal MATCH_0 is activated, and activate a redundant row RWL2 when the match signal MATCH_2 is activated. The row circuit 190 may activate one of the normal rows WL0 to WLN by decoding the address ADDRESS_L<15:0> during an active operation. However, when one of the match signals MATCH_0 to MATCH_3 is activated, that is, when the address ADDRESS_L<15:0> matches one of the failure addresses FAIL_ADDRESS_0<15:0> to FAIL_ADDRESS_3<15:0>, one of the redundant rows may be activated instead of the defective normal row.

When the failure addresses FAIL_ADDRESS_0<15:0> to FAIL_ADDRESS_3<15:0> stored in the register circuits 120 overlap or two or more among the match signals MATCH_0 to MATCH_3 are redundantly activated due to an error, the row circuit 190 may activate a redundant row corresponding to a low-numbered match signal among the activated match signals. This gives priority to soft repair when several repair operations overlap.

The cell array 195 may include memory cells that are arranged in a plurality of rows and a plurality of columns. Here, the rows of the cell array 195 may also be referred to as word lines.

The resource latch circuits 130 may generate resource signals RESOURCE<0:3> which respectively indicate availability of the register circuits 120. The resource signals RESOURCE<0:3> may indicate a set of one or more register circuits (i.e., a register set) which are available for soft repair among the register circuits 120. When one of the register circuits 120 has been already used for repair (normal repair) using the non-volatile memory 100 or when a redundant row corresponding to one of the register circuits 120 is defective, the register circuit may be in an unavailable state.

The priority selection circuit 140 may receive the resource signals RESOURCE<0:3> and generate selection signals SELECT<0:3>. The selection signals SELECT<0:3> may be signals for selecting a register set to be used for soft repair among the register circuits 120. When two or more resource signals RESOURCE<0:3> are activated, the priority selection circuit 140 may activate only one selection signal among the selection signals corresponding to the activated resource signals. That is, when there are two or more available register circuits, the priority selection circuit 140 may be used to select one of the two or more available register circuits.

The control circuit 150 may be a circuit for controlling an undo operation and a lock operation. The undo operation may be an operation to cancel soft repair for a particular failure address. Also, the lock operation may be an operation for making the soft repair for a particular failure address into a state in which an undo operation is impossible.

The access mask circuit 160 may perform a control in such a manner that additional soft repair is not possible for a failure address that is locked after the soft repair.

Figure 2:
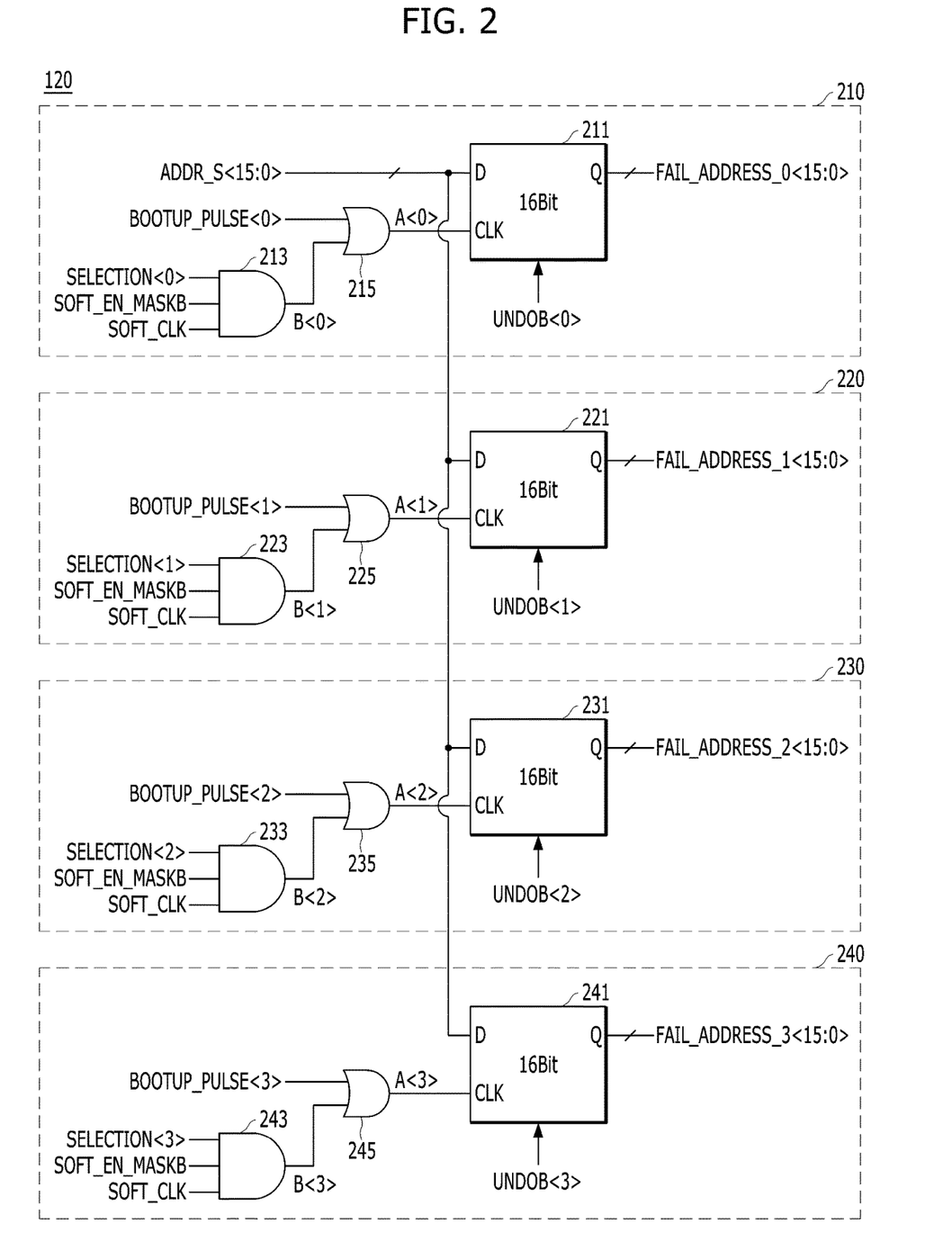
FIG. 2 is a block diagram illustrating register circuits 120 shown in FIG. 1 in accordance with an embodiment of the present invention.

FIG. 2 is a block diagram illustrating the register circuits 120 shown in FIG. 1 in accordance with an embodiment of the present invention.

Referring to FIG. 2, the register circuits 120 may include four register circuits 210 to 240. The four resistor circuits 210 to 240 may include latches 211, 221, 231 and 241, AND gates 213, 223, 233 and 243, and OR gates 215, 225, 235 and 245, respectively. Here, it is illustrated that the number of the register circuits 120 is four, but this is mere an example, and those skilled in the art would realize that the number of the register circuits 120 may be different from this example.

Boot-up pulse signals BOOTUP_PULSE<0:3> may be signals for selecting a register circuit to store the address ADDR_S<15:0> which is selected by the selection circuit 121 among the register circuits 210 to 240 during a boot-up operation. For example, the boot-up pulse signal BOOTUP_PULSE<0> may be a signal for selecting the register circuit 210, and the boot-up pulse signal BOOTUP_PULSE<1> may be a signal for selecting the register circuit 220.

The selection signals SELECT<0:3> may be signals for selecting a register circuit to store the address ADDR_S<15:0> which is selected by the selection circuit 121 among the register circuits during a soft repair operation. For example, a selection signal SELECT<1> may be a signal for selecting the register circuit 220, and a selection signal SELECT<3> may be a signal for selecting the register circuit 240.

A soft mask signal SOFT_EN_MASKB may be a signal that is activated to a level of '0' when a soft repair operation needs to be prevented by a lock operation while maintaining a level of '1'.

A soft clock SOFT_CLK may be a clock that toggles during a soft repair operation.

OR gates 215, 225, 235 and 245 may activate signals A<0:3> to a level of '1' when the boot-up pulse signals BOOTUP_PULSE<0:3> are activated to a level of '1' or signals B<0:3> are activated. AND gates 213, 223, 233 and 243 may activate signals B<0:3> when the soft clock SOFT_CLK and the selection signals SELECTION<0:3> are activated to a level of '1'. Herein, the AND gates 213, 223, 233 and 243 may mask the signals B<0:3> not to be activated when the soft mask signal SOFT_EN_MASKB is activated to a level of '0'.

Each of the latches 211, 221, 231 and 241 may store 16 bits. The latches 211, 221, 231 and 241 may include an input terminal D, an output terminal Q, and a clock terminal CLK. The latches 211, 221, 231 and 241 may receive and store the address ADDR_S<15:0> transferred to the input terminal D when the signal B<0:3> of the clock terminal CLK is activated. The failure addresses FAIL_ADDRESS_0<15:0> to FAIL_ADDRESS_3<15:0> stored in the latches 211, 221, 231 and 241 may be output to the output terminal Q. Information stored in the latches 211, 221, 231 and 241 may be initialized when the undo signals UNDOB<0:3> are activated.

During a boot-up operation, the selection circuit 121 may select and output a failure address ARE_ADDR<15:0> transferred from the non-volatile memory circuit 110 (ADDR_S<15:0>=ARE_ADDR<15:0>). Therefore, a latch corresponding to the activated boot-up selection signal among the boot-up pulse signals BOOTUP_PULSE<0:3> may receive and store the failure address ARE_ADDR<15:0>.

During a soft repair operation, the selection circuit 121 may select and output the failure address ADDR<15:0> transferred from the outside of the memory 100 (ADDR_S<15:0>=ADDR<15:0>). Therefore, when the soft mask signal SOFT_EN_MASKB maintains the level of '1', a latch corresponding to the activated selection signal among the selection signals SELECT<0:3> may receive and store the failure address ADDR<15:0>.

Figure 3:
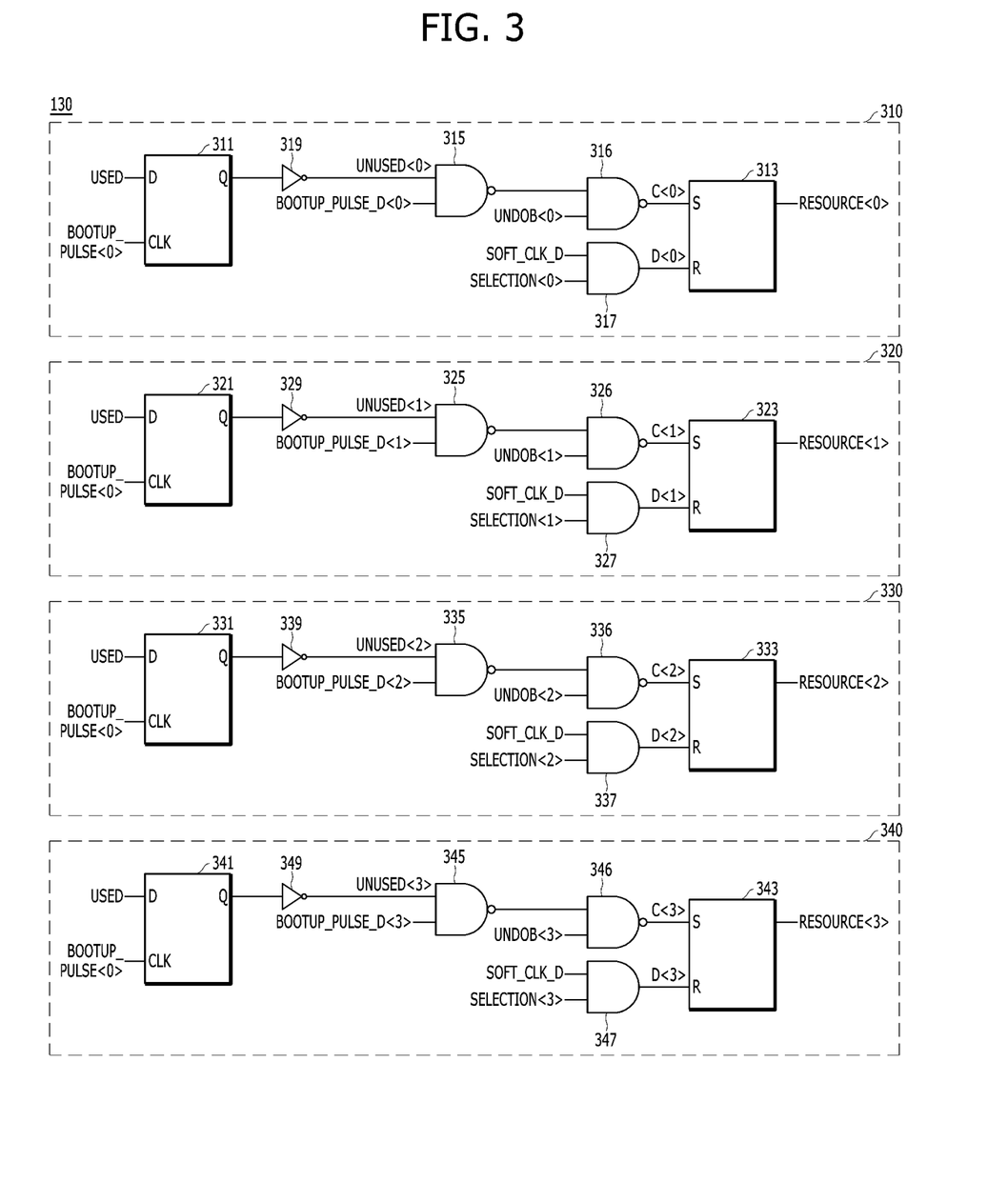
FIG. 3 is a block diagram illustrating resource latch circuits 130 shown in FIG. 1 in accordance with an embodiment of the present invention.

FIG. 3 is a block diagram illustrating the resource latch circuits 130 shown in FIG. 1 in accordance with an embodiment of the present invention.

Referring to FIG. 3, the resource latch circuits 130 may include four resource latch circuits 310 to 340. The number of the resource latch circuits 130 may be the same as the number of the register circuits 120.

The resource latch circuits 310 to 340 may include first latches 311, 321, 331, and 341, second latches 313, 323, 333, and 343, NAND gates 315, 325, 335, 345, 316, 326, 336, and 346, AND gates 317, 327, 337, and 347, and inverters 319, 329, 339, and 349, respectively.

The first latches 311, 321, 331, and 341 may receive and store a used signal USED when the boot-up pulse signals BOOTUP_PULSE<0:3> are activated. The used signal USED may be a signal transferred from the non-volatile memory 110 during a boot-up operation, and the used signal USED may represent whether or not the corresponding register circuits 210 to 240 are used for a normal repair operation, which is a repair operation other than a soft repair operation. Activation of the used signal USED may indicate that the register circuits 210 to 240 are already used or the register circuits 210 to 240 cannot be used anymore because the register circuits 210 to 240 are defective. Deactivation of the used signal USED may indicate that the register circuits 210 to 240 may be used. For example, when the register circuit 210 is used during a normal repair operation, the used signal USED may be activated to a level of '1' when the boot-up pulse signal BOOTUP_PULSE<0> is activated. Also, when the register circuit 220 is not used during a normal repair operation, the used signal USED may be deactivated to a level of '0' when the boot-up pulse signal BOOTUP_PULSE<1> is activated.

The inverters 319, 329, 339, and 349 may invert outputs of the first latches 311, 321, 331, and 341 to generate unused signals UNUSED<0:3>.

The NAND gates 315, 325, 335, and 345 may receive the unused signals UNUSED<0:3> and delayed boot-up pulse signals BOOTUP_PULSE_D<0:3>. The delayed boot-up pulse signals BOOTUP_PULSE_D<0:3> may be signals obtained by slightly delaying the boot-up pulse signals BOOTUP_PULSE<0:3> for a timing margin. Output signals of the NAND gates 315, 325, 335, and 345 may have the inverted levels of the unused signals UNUSED<0:3> and may be a bit late in terms of timing compared with the unused signals UNUSED<0:3>.

The NAND gates 316, 326, 336, and 346 may receive the output signals of the NAND gates 315, 325, 335 and 345 and the undo signals UNDOB<0:3> and generate signals C<0:3>. The undo signals UNDOB<0:3> may be signals activated to a level of '0' during an undo operation performed onto the corresponding register circuits 210 to 240. In general cases, the undo signals UNDOB<0:3> maintain a level of '1'. Thus, in most cases, the levels of the signals C<0:3> may be the same as the levels of the unused signals UNUSED<0:3>.

The AND gates 317, 327, 337, and 347 may receive a delayed soft clock SOFT_CLK_D, the selection signals SELECT<0:3>, and the output signals D<0:3>. Since the delayed soft clock SOFT_CLK_D is a clock obtained by delaying the soft clock SOFT_CLK, the signals D<0:3> may be the signals that are activated after the register circuits 210 to 240 are selected based on the selection signals SELECT<0:3>. For example, after the register circuit 220 is selected based on the selection signal SELECT<1>, a signal D<1> may be activated.

The second latches 313, 323, 333, and 343 may activate the resource signals RESOURCE<0:3> to a level of '1' in response to the signals C<0:3> being activated to a level of '1' and deactivate the resource signals RESOURCE<0:3> to a level of '0' in response to the signals D<0:3> being activated to a level of '1'. The second latches 313, 323, 333, and 343 may be SR latches that use the signals C<0:3> as a set signal and use the signals D<0:3> as a reset signal.

The resource signals RESOURCE<0:3> may be signals that are normally activated when unused signals UNUSED<0:3> are activated and deactivated after the selection signals SELECTION<0:3> are activated. The resource signals RESOURCE<0:3> may be signals which have a level of '1' when the corresponding register circuits 210 to 240 are available and have a level of '0' after the register circuits 210 to 240 are used. However, when the undo signals UNDOB<0:3> are activated to a level of '0', the resource signals RESOURCE<0:3> may be activated again from the deactivated state. For example, when the undo signal UNDOB<2> is activated to a level of '0' while the resource signal RESOURCE<2> is deactivated to a level of '0', the resource signal RESOURCE<2> may be activated to a level of '1'.

Figure 4:
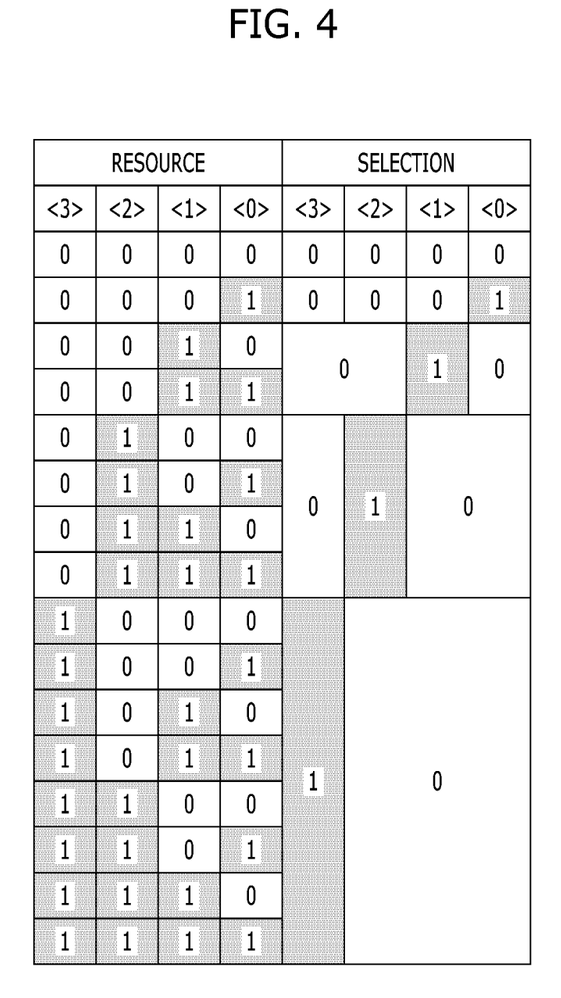
FIG. 4 illustrates an operation of a priority selection circuit 140 shown in FIG. 1 in accordance with an embodiment of the present invention.

FIG. 4 illustrates an operation of the priority selection circuit 140 shown in FIG. 1 in accordance with an embodiment of the present invention.

Referring to FIG. 4, it may be seen that the priority selection circuit 140 activates, when several resource signals RESOURCE<0:3> are activated together, the selection signal corresponding to the resource signal of the highest rank in a descending order of the activated resource signals.

When one resource signal RESOURCE<2> is activated to a level of '1', it may be seen that the corresponding selection signal SELECTION<2> is activated to a level of '1'.

When the resource signals RESOURCE<0> and RESOURCE<2> are activated to a level of '1', the selection signal SELECTION<2> corresponding to the resource signal RESOURCE<2> of the highest rank in a descending order of the activated resource signals RESOURCE<0> and RESOURCE<2> may be activated to a level of '1'. Similarly, when the resource signals RESOURCE<1>, RESOURCE<2>, and RESOURCE<3> are activated to a level of '1', the selection signal SELECTION<3> corresponding to the resource signal RESOURCE<3> of the highest rank in a descending order of the activated resource signals RESOURCE<1>, RESOURCE<2>, and RESOURCE<3> may be activated to a level of '1'.

The priority selection circuit 140 may activate, when several resource signals RESOURCE<0:3> are activated together, the selection signal corresponding to the resource signal of the highest number in a descending order of the activated resource signals. In other words, when the register circuits 210 to 240 are used redundantly, it may be preferable to use a register circuit in a descending order for repair. As described above, when the match signals MATCH_0 to MATCH_3 are redundantly activated, the row circuit 190 may activate a redundant row corresponding to the match signal of the lowest number in an ascending order of the activated match signals. Since a soft repair operation is generally performed later than a normal repair operation and a register circuit is also preferentially used in a descending order in a normal repair operation, when a soft repair operation and a normal repair operation are performed overlappingly, the soft repair operation may be preferentially performed.

Figure 5:
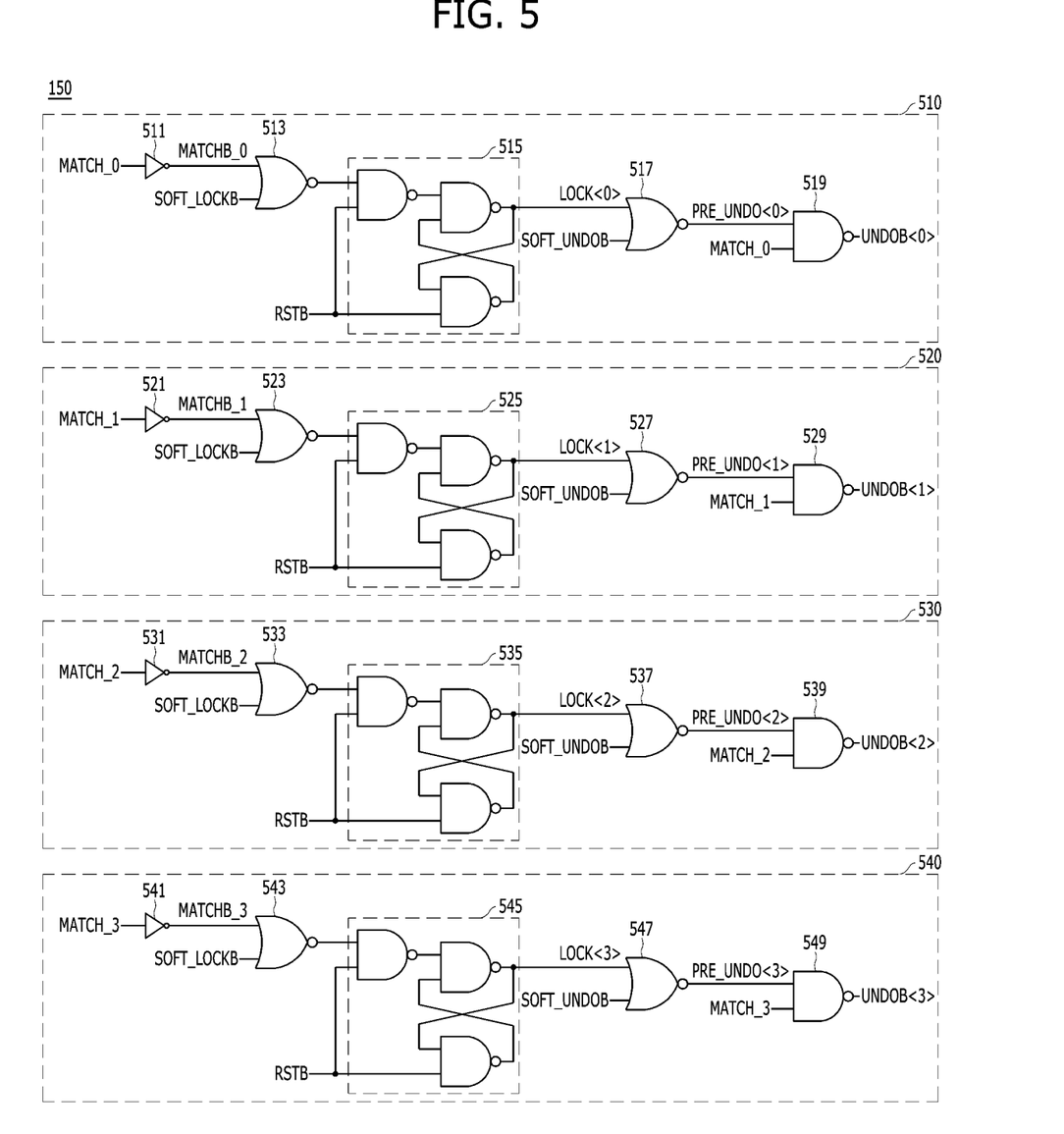
FIG. 5 is a block diagram illustrating a control circuit 150 shown in FIG. 1 in accordance with an embodiment of the present invention.

FIG. 5 is a block diagram illustrating the control circuit 150 shown in FIG. 1 in accordance with an embodiment of the present invention.

Referring to FIG. 5, the control circuit 150 may include first to fourth circuits 510 to 540. The first to fourth circuits 510 to 540 may generate lock signals LOCK<0:3> and undo signals UNDOB<0:3>. The lock signals LOCK<0:3> may be signals for putting the corresponding register circuits 210 to 240 into a locked state, and the undo signals UNDOB<0:3> may be signals to undo the corresponding register circuits 210 to 240).

The first to fourth circuits 510 to 540 may include inverters 511, 521, 531, and 541, NOR gates 513, 523, 533, and 543, SR latches 515, 525, 535, and 545, NOR gates 517, 527, 537, and 547, and NAND gates 519, 529, 539, and 549, respectively.

The inverters 511, 521, 531, and 541 may generate inverted match signals MATCHB_0 to MATCHB_3 by inverting the match signals MATCH_0 to MATCH_3.

The NOR gates 511, 521, 531, and 541 may receive a soft lock signal SOFT_LOCKB and the inverted match signals MATCHB_0 to MATCHB_3. The soft lock signal SOFT_LOCKB may be a signal that is activated to a level of '0' when there is a lock command from the memory controller. An address corresponding to a lock operation may be input from the memory controller together with a lock command, and when the address matches the failure addresses FAIL_ADDRESS_0<15:0> to FAIL_ADDRESS_3<15:0> stored in the register circuits 210 to 240, the inverted match signal may be activated to a level of '0'.

When the soft lock signal SOFT_LOCKB and the inverted match signal MATCHB_0 are simultaneously activated to a level of '0', the lock signal LOCK<0> may be activated to a level of '1' by the SR latch 515. Activation of the lock signal LOCK<0> to a level of '1' may mean that the register circuit 210 is in a locked state.

When the soft lock signal SOFT_LOCKB and the inverted match signal MATCHB_1 are simultaneously activated to a level of '0', the lock signal LOCK<1> may be activated to a level of '1' by the SR latch 525. The activation of the lock signal LOCK<1> to a level of '1' may mean that the register circuit 220 is in a locked state.

When the soft lock signal SOFT_LOCKB and the inverted match signal MATCHB_2 are simultaneously activated to a level of '0', the lock signal LOCK<2> may be activated to a level of '1' by the SR latch 535. The activation of the lock signal LOCK<2> to a level of '1' may mean that the register circuit 230 is in a locked state.

When the soft lock signal SOFT_LOCKB and the inverted match signal MATCHB_3 are simultaneously activated to a level of '0', the lock signal LOCK<3> may be activated to a level of '1' by the SR latch 545. Activation of the lock signal LOCK<3> to a level of '1' may mean that register circuit 240 is in a locked state.

The lock signals LOCK<0:3> that are activated to a level of '1' by the SR latches 515, 525, 535, and 545 may maintain the level of '1' until the reset signal RSTB is activated to a level of '0'.

The NOR gates 517, 527, 5378, and 547 may receive the lock signal LOCK<0:3> and a soft undo signal SOFT_UNDOB and output a pre-undo signal PRE_UNDO<0:3>. The soft undo signal SOFT_UNDOB may be a signal which is activated to a level of '0' when an undo command is received from the memory controller. The pre-undo signal PRE_UNDO<0:3> may be a signal that is activated to a level of '1' when the soft undo signal SOFT_UNDOB is activated to a level of '0' while the lock signal LOCK<0:3> is deactivated to a level of '0'.

The NAND gates 519, 529, 539, and 549 may receive the pre-undo signal PRE_UNDO<0:3> and the match signal MATCH_0 to MATCH_3 to generate the undo signal UNDOB<0:3>. When the pre-undo signal PRE_UNDO<0:3> and the match signals MATCH_0 to MATCH_3 are simultaneously activated to a level of '1', the undo signal UNDOB<0:3> may be activated to a level of '0'.

To summarize the operation of the control circuit 150, when one of the match signals MATCH_0 to MATCH_3 is activated together with the soft lock signal SOFT_LOCKB, a lock signal corresponding to an activated match signal among the lock signals LOCK<0:3> may be activated. For example, when the soft lock signal SOFT_LOCKB and the match signal MATCH_3 are activated, the lock signal LOCK<3> may be activated. Also, when one of the match signals MATCH_0 to MATCH_3 is activated together with the soft undo signal SOFT_UNDOB, an undo signal corresponding to the activated match signal among the undo signals UNDOB<0:3> may be activated. For example, when the soft undo signal SOFT_UNDOB and the match signal MATCH_1 are activated, the undo signal UNDOB<1> may be activated. However, the undo signal UNDOB<0:3> may not be activated when the lock signal LOCK<0:3> is activated. For example, when the lock signal LOCK<0> is activated, the undo signal UNDOB<0> may not be activated.

Figure 6:
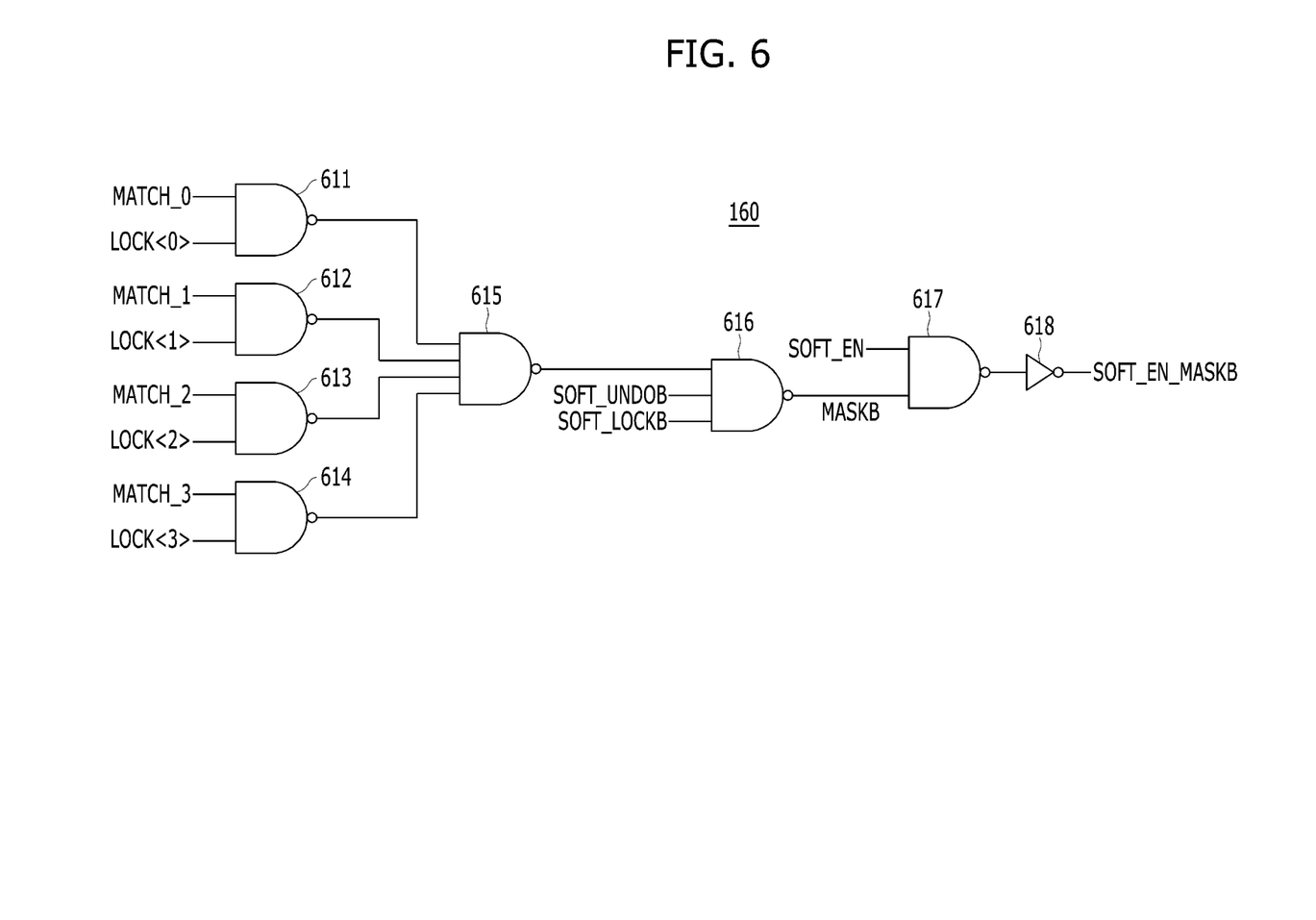
FIG. 6 is a block diagram illustrating an access mask circuit 160 shown in FIG. 1 in accordance with an embodiment of the present invention.

FIG. 6 is a block diagram illustrating the access mask circuit 160 shown in FIG. 1 in accordance with an embodiment of the present invention.

Referring to FIG. 6, the access mask circuit 160 may include NAND gates 611 to 617 and an inverter 618.

The NAND gate 611 may receive a match signal MATCH_0 and a lock signal LOCK<0>. The output signal of the NAND gate 611 may be '0' when the lock signal LOCK<0> is activated to a level of '1' and the match signal MATCH_0 is activated '1'. Otherwise, it may become '1'. In other words, the output signal of the NAND gate 611 may be '0' when the same address ADDRESS<15:0> as the failure address FAIL_ADDRESS_0<15:0> stored in the register circuit 210 is transferred from the memory controller after the register circuit 210 is locked.

The NAND gate 612 may receive a match signal MATCH_1 and a lock signal LOCK<1>. The output signal of the NAND gate 612 may be '0' when the lock signal LOCK<1> is activated to a level of '1' and the match signal MATCH_1 is activated to a level of '1'. Otherwise, it may become '1'. In other words, the output signal of the NAND gate 612 may be '0' when the same address ADDRESS<15:0> as the failure address FAIL_ADDRESS_1<15:0> stored in the register circuit 220 is transferred from the memory controller after the register circuit 220 is locked.

The NAND gate 613 may receive a match signal MATCH_2 and a lock signal LOCK<2>. The output signal of the NAND gate 613 may be '0' when the lock signal LOCK<2> is activated to a level of '1' and the match signal MATCH_2 is activated to a level of '1'. Otherwise, it may become '1'. In other words, the output signal of the NAND gate 613 may be '0' when the same address ADDRESS<15:0> as the failure address FAIL_ADDRESS_2<15:0> stored in the register circuit 230 is transferred from the memory controller after the register circuit 230 is locked.

The NAND gate 614 may receive a match signal MATCH_3 and a lock signal LOCK<3>. The output signal of the NAND gate 614 may be '0' when the lock signal LOCK<3> is activated to a level of '1' and the match signal MATCH_3 is activated to a level of '1'. Otherwise, it may become '1'. In other words, the output signal of the NAND gate 614 may be '0' when the same address ADDRESS<15:0> as the failure address FAIL_ADDRESS_3<15:0> stored in the register circuit 240 is transferred from the memory controller after the register circuit 240 is locked.

The NAND gate 615 may receive the outputs of the NAND gates 611 to 614. The output of the NAND gate 615 may become '1' when there is '0' among the outputs of the NAND gates 611 to 614, and the output of the NAND gate 615 may become '0' when the outputs of the NAND gates 611 to 614 are all '1'.

The NAND gate 616 may receive the output of the NAND gate 615, a soft undo signal SOFT_UNDOB, and a soft lock signal SOFT_LOCKB to output a mask signal MASKB. Since the soft undo signal SOFT_UNDOB and the soft lock signal SOFT_LOCKB may maintain a value of '1' unless an undo operation is being performed or a lock operation is being performed, the NAND gate 616 may generate the mask signal MASKB by inverting the output of the NAND gate 615 in most cases.

The NAND gate 617 may receive and output a soft repair signal SOFT_EN and the mask signal MASKB that are activated during a soft repair operation, and the inverter 618 may invert the output of the NAND gate 617 to output a soft mask signal SOFT_EN_MASKB. The soft mask signal SOFT_EN_MASKB may be a signal that is activated to a level of '0' when the mask signal MASKB is activated to a level of '0' during a soft repair operation.

To summarize the operation of the access mask circuit 160, when a new soft repair operation is to be performed on the same address as the failure address which is stored in the locked register among the register circuits 210 to 240, the access mask circuit 160 may activate the soft mask signal SOFT_EN_MASKB for preventing the new soft repair operation to a level of '0'. When the soft mask signal SOFT_EN_MASKB is activated to a level of '0', the signals B<0:3> of FIG. 2 may not be activated. Thus, no new address may be stored in the register circuits 210 to 240.

Figure 7:
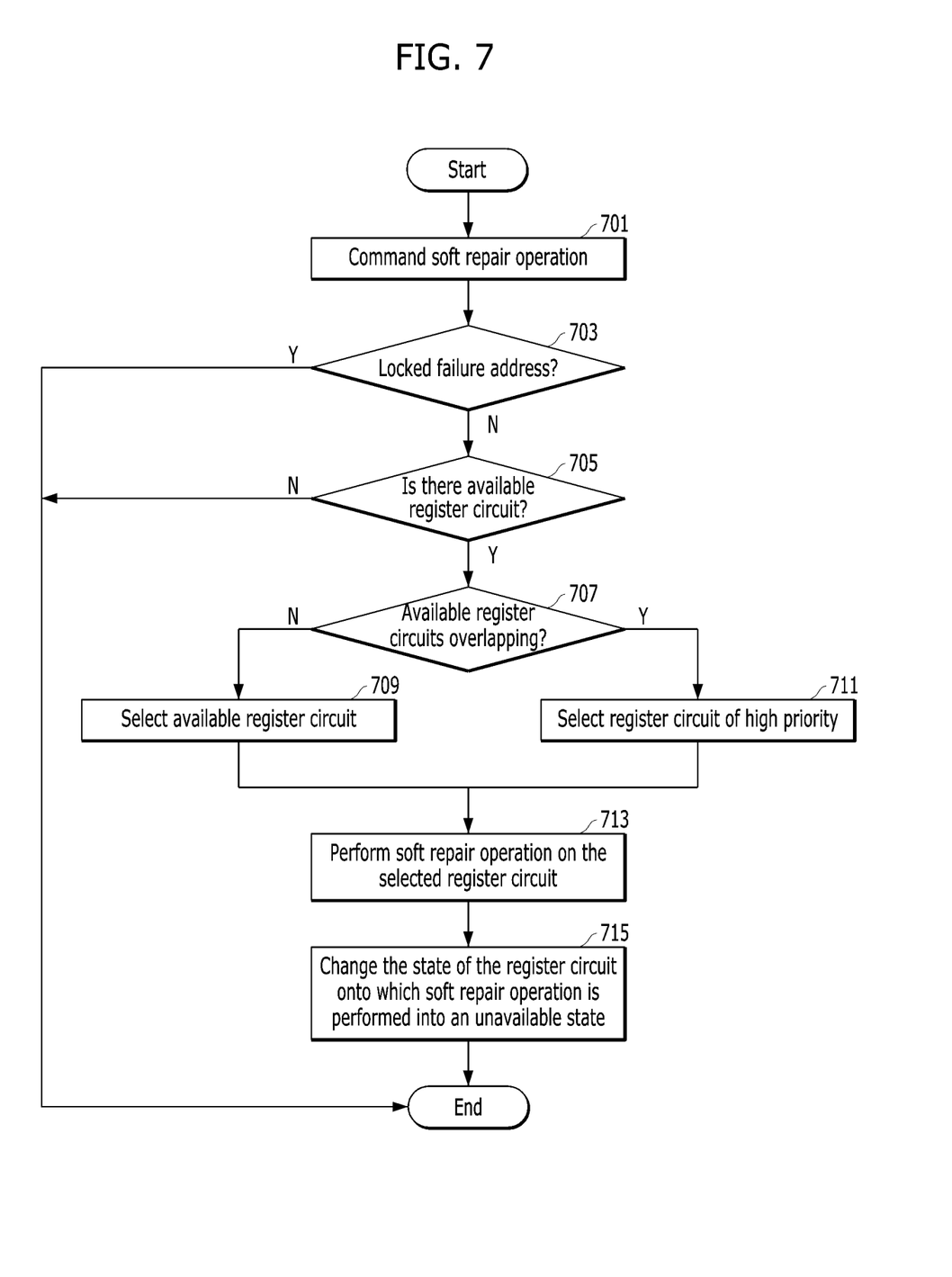
FIG. 7 is a flowchart describing a soft repair operation of the memory 100 shown in FIG. 1 in accordance with an embodiment of the present invention.

FIG. 7 is a flowchart describing a soft repair operation of the memory 100 shown in FIG. 1 in accordance with an embodiment of the present invention.

Referring to FIG. 7, in operation S701, there may be a command for a soft repair operation. The soft repair operation may begin as the memory controller transfers a failure address ADDR<15:0> to the memory 100 together with a soft repair command. When a soft repair operation begins, a soft repair signal SOFT_EN may be activated.

In operation S703, it may be determined whether the command of the soft repair operation relates to a locked failure address or not. When the failure address ADDR<15:0> for a current soft repair operation is the same as the failure address already stored in the locked register among the register circuits 210 to 240 shown in FIG. 2 (Y in the operation S703), that is, when the soft mask signal SOFT_EN_MASKB is activated to a level of '0', the soft repair operation may not be performed but may be terminated immediately. Otherwise (N in the operation S703), a soft repair operation may be performed.

In operation S705, it may be checked whether there are one or more register circuits available for the soft repair operation. When all of the resource signals RESOURCE<0:3> of FIG. 3 are deactivated, it may mean that there is no register circuit available for a soft repair operation among the register circuits 210 to 240, so it is impossible to perform a soft repair operation. In this case, the soft repair operation may be terminated (N in the operation S705).

When there is a single available register circuit (N in operation S707), the single available register circuit may be selected for a soft repair operation in operation S709. For example, when only the resource signal RESOURCE<2> is activated among the resource signals RESOURCE<0:3>, the register circuit 230 may be selected as a register circuit on which a soft repair operation is to be performed.

When there are a plurality of available register circuits (Y in the operation S707), the priority selection circuit 140 may select, as a register circuit for a soft repair operation, the register circuit having the highest priority among the available register circuits in operation S711. For example, when the resource signals RESOURCE<1> and RESOURCE<3> are activated, the register circuit 240 may be selected as a register circuit on which a soft repair operation is to be performed.

A soft repair operation of storing the failure address ADDR<15:0> transferred from the memory controller in the register circuit which is selected in the operation S709 or S711 may be performed in operation S713.

Then, the state of the register circuit on which the soft repair operation has been performed may be changed to an unavailable state in operation S715. That is, a resource signal corresponding to the register circuit on which the soft repair operation is performed may be deactivated from a level of '1' to a level of '0'. For example, when the register circuit 220 is used for a soft register operation, the resource signal RESOURCE<1> of the register circuit 220 may be changed from a level of '1' to a level of '0'.

After the soft repair operation is performed, the normal row corresponding to the failure address which is stored in the register circuit on which the soft register operation is performed may be repaired with a redundant row.

Figure 8:
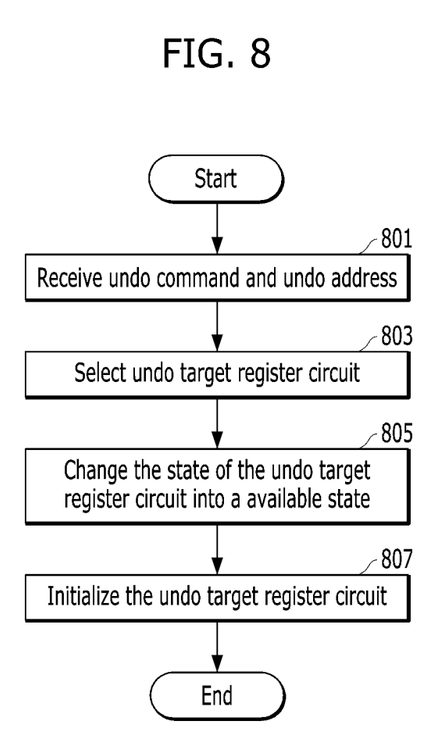
FIG. 8 is a flowchart describing an undo operation of the memory 100 shown in FIG. 1 in accordance with an embodiment of the present invention.

FIG. 8 is a flowchart describing an undo operation of the memory 100 shown in FIG. 1 in accordance with an embodiment of the present invention.

Referring to FIG. 8, first, the memory 100 may receive an undo command and an undo address transferred from the memory controller in operation S801.

An undo target may be selected among the register circuits 210 to 240 in operation S803. A register circuit storing the same failure address as the undo address among the register circuits 210 to 240 may be selected as an undo target. Among the undo signals UNDOB<0:3>, a register circuit corresponding to the undo signal which is activated by the control circuit 150 of FIG. 5 may be the undo target.

The state of the undo target register circuit may be changed into an available state in operation S805. Referring to FIG. 3, the undo signals UNDOB<0:3> may be used to control the second latches 313, 323, 333 and 343, and among the undo signals UNDOB<0:3>, the resource signal stored in the second latch corresponding to the activated undo signal may be changed from '0' to '1'. For example, when the register circuit 230 is an undo target, a resource signal RESOURCE<2> of the register circuit 230 may be changed from a level of '0' to a level of '1'.

The undo target register circuit may be initialized in operation S807. In other words, a latch of an undo target register circuit among the latches 211, 221, 231, and 241 shown in FIG. 2 may be initialized by an undo signal. For example, when the register circuit 230 is the undo target, the latch 231 of the register circuit 230 may be initialized by the undo signal UNDOB<2>.

The repair operation by the undo target register circuit may be canceled by an undo operation, and the undo target register circuit may go back into an available state.

Figure 9:
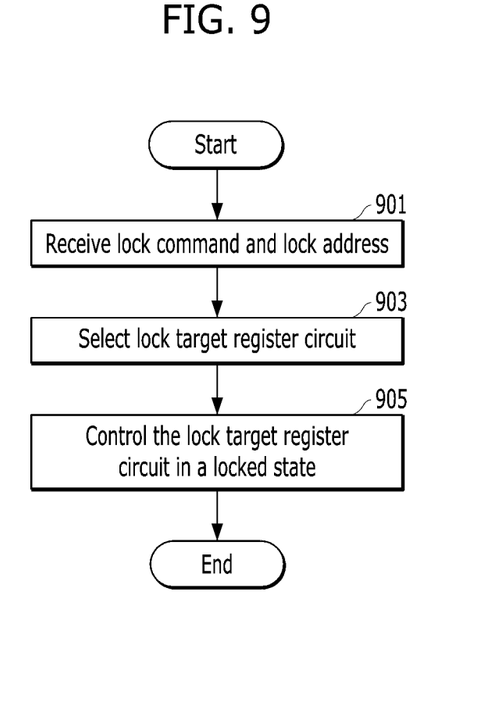
FIG. 9 is a flowchart describing a lock operation of the memory 100 shown in FIG. 1 in accordance with an embodiment of the present invention.

FIG. 9 is a flowchart describing a lock operation of the memory 100 shown in FIG. 1 in accordance with an embodiment of the present invention.

Referring to FIG. 9, first, the memory 100 may receive a lock command and a lock address transferred from the memory controller in operation S901.

A lock target may be selected among the register circuits 210 to 240 in operation S903. A register circuit storing the same failure address as the lock address among the register circuits 210 to 240 may be selected as a lock target. Among the lock signals LOCK<0:3>, a register circuit corresponding to a lock signal which is activated by the control circuit 150 of FIG. 5 may be a lock target.

The lock target register circuit may be controlled into a locked state in operation S905. When the lock signal corresponding to the lock target register circuit is activated to a level of '1', the corresponding register circuit may be locked. After the lock, it may be impossible to undo the corresponding register circuit, and it may be impossible to further perform a repair operation on the same address as the failure address which is stored in the corresponding register. For example, when the lock signal LOCK<0> is activated to a level of '1', it may be impossible to undo the register circuit 210, and it may be impossible to further perform a soft repair operation on the same address as the failure address FAIL_ADDRESS_0<15:0> which is stored in the register circuit 210.

According to embodiments of the present invention, a register circuit to be used for a soft repair operation may be efficiently selected among a plurality of available register circuits. Also, an undo target register circuit and a lock target register circuit may be efficiently selected during undo and lock operations.

According to an embodiment of the present invention, repair resources inside a memory may be efficiently allocated and managed.

The effects desired to be obtained in various embodiments of the present invention are not limited to the effects described above, and other effects not described above may also be clearly understood by those of ordinary skill in the art to which the present invention pertains from the description above.

While the present invention has been described with respect to specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory comprising:
first to $N^{th}$ register circuits each configured to receive and store a failure address transferred from a memory controller when a corresponding selection signal of first to $N^{th}$ selection signals is activated, where N is an integer equal to or greater than 2;
first to $N^{th}$ resource latch circuits configured to store first to $N^{th}$ resource signals indicating availability of the first to $N^{th}$ register circuits, respectively; and
a priority selection circuit configured to activate, when two or more of the first to $N^{th}$ resource signals are activated, a high priority selection signal of selection signals respectively corresponding to the activated resource signals among the first to $N^{th}$ selection signals,
wherein the high priority selection signal activates one register circuit having a high priority among the first to $N^{th}$ register circuits.

2. The memory of claim 1,
further comprising a control circuit configured to activate a resource signal corresponding to a register circuit storing a same failure address as an address transferred along with an undo command from the memory controller among the first to $N^{th}$ register circuits.

3. The memory of claim 2, wherein the register circuit storing the same failure address is further configured to initialize the failure address stored therein.

4. The memory of claim 2, wherein the control circuit is further configured to set, into a locked state in which an undo operation is impossible, a register circuit storing a same failure address as an address transferred along with a lock command from the memory controller among the first to $N^{th}$ register circuits.

5. The memory of claim 4, further comprising an access mask circuit configured to control the register circuit storing the same failure address as the address transferred along with the lock command in such a manner that an additional soft repair operation is not possible with respect to the address transferred along with the lock command.

6. The memory of claim 1, further comprising:
an address comparison circuit configured to generate first to $N^{th}$ match signals by comparing failure addresses stored in the first to $N^{th}$ register circuits with an address transferred from the memory controller; and
a row circuit configured to:
activate one of a plurality of normal rows by decoding the address transferred from the memory controller when all of the first to $N^{th}$ match signals are deactivated, and
activate, when one of the first to $N^{th}$ match signals is activated, a redundant row corresponding to the activated match signal among first to $N^{th}$ redundant rows.

7. The memory of claim 6,
wherein the priority selection circuit activates a selection signal corresponding to a resource signal selected in a descending order among the activated resource signals, and
wherein the row circuit activates, when two or more of the first to $N^{th}$ match signals are activated, a redundant row corresponding to a match signal selected in an ascending order among the activated match signals.

8. The memory of claim 1,
further comprising a non-volatile memory circuit,
wherein each of the first to $N^{th}$ register circuits is further configured to receive and store a failure address transferred from the non-volatile memory circuit when a corresponding boot-up pulse of first to $N^{th}$ boot-up pulses is activated.

9. The memory of claim 1, wherein each of the first to $N^{th}$ resource signals is deactivated when a corresponding register circuit of the first to $N^{th}$ register circuits is defective or used for a repair operation, and activated otherwise.

10. The memory of claim 1, wherein the priority selection circuit selects as a register circuit for a soft repair operation, the register circuit having the highest priority among the first to $N^{th}$ register circuits.

* * * * *